US006917909B1

(12) United States Patent
Markov et al.

(10) Patent No.: US 6,917,909 B1
(45) Date of Patent: Jul. 12, 2005

(54) FACILITATING GUIDANCE PROVISION FOR AN ARCHITECTURAL EXPLORATION BASED DESIGN CREATION PROCESS

(76) Inventors: Lev A. Markov, 59 Sedgemeadow Rd., Wayland, MA (US) 91778; Ian Andrew Guyler, 28663 Crestwood Dr., Wilsonville, OR (US) 97070; Shiv Prakash, 10688 SW. Cottonwood St., Tualatin, OR (US) 97062; David G. Burnette, 14305 SW. 14th Ave., Tigard, OR (US) 97224

(*) Notice: Subject to any disclaimer, the term of this patent is extended or adjusted under 35 U.S.C. 154(b) by 645 days.

(21) Appl. No.: 09/080,869

(22) Filed: May 18, 1998

(51) Int. Cl.[7] .............................................. G06F 17/50

(52) U.S. Cl. ................................ 703/14; 703/1; 703/2; 716/4; 716/8

(58) Field of Search ...................... 703/1–2, 14; 716/4, 716/8

(56) References Cited

U.S. PATENT DOCUMENTS

| 5,404,319 A | | 4/1995 | Smith et al. | |
|---|---|---|---|---|
| 5,428,740 A | * | 6/1995 | Wood et al. | 345/440 |
| 5,623,419 A | | 4/1997 | Kundert | |
| 5,634,115 A | | 5/1997 | Fitzpatrick et al. | |
| 5,764,951 A | | 6/1998 | Ly et al. | |
| 5,870,308 A | * | 2/1999 | Dangelo et al. | 395/500.19 |
| 5,880,971 A | * | 3/1999 | Dangelo et al. | 395/500.07 |
| 5,912,819 A | | 6/1999 | Kucukcakar et al. | |

OTHER PUBLICATIONS

Hsu et al, "Digital Design From Concept to Prototype in Hours", 1994 IEEE Asia–Pacific Conference on Circuits and Systems, pp. 175–181, Dec. 1994.*

Zivojnovic et al, "LISA—Machine Description Language and Generic Machine Model for HW/SW Co–Design", IEEE 1996 Workshop on VLSI Signal Processing, pp. 127–136, Oct. 1996.*

Middelhoek et al, "From VHDL to Efficient and First–Time–Right Designs: A Formal Approach", ACM Transactions on Design Automation of Electronic Systems, vol. 1 No. 2, pp. 205–250, Apr. 1996.*

Goering, "Cadence Mounts Synthesis Threat", Electronic Engineering Times, pp. 1 and 130 (Jan. 27, 1997).*

(Continued)

Primary Examiner—Samuel Broda
(74) Attorney, Agent, or Firm—Schwabe, Williamson & Wyatt, P.C.

(57) ABSTRACT

Guidance provision to the creation of an electronic design is facilitated through a method that includes facilitating interactive exploration of the electronic design by a designer to aid the designer in formulating his/her guidance, and facilitating the designer in interactively providing the formulated guidance. In one embodiment, facilitation of interactive exploration by the designer include facilitating interactive cross-probing into a number of issues about the design, including generated candidate architectures for the design. In one embodiment, the issues available for cross probing include inter-dependencies of data and mobility of operations of the design, as well as occupation of hardware resources for the generated candidate architectures. In one embodiment, Gantt diagrams are employed to facilitate navigation by the designer in performing the interactive cross probing. Gantt diagrams graphically representing the generated candidate architectures are selectively presented to the designer. Data dependencies may be graphically depicted on the Gantt diagrams. Additionally, various aspects of the generated candidate architectures may be correlated back to the behavioral specification of the electronic design for the designer. In one embodiment, the designer may also modified the constraints on the electronic design interactively, applying the information the designer learned through the interactive exploration.

33 Claims, 12 Drawing Sheets

OTHER PUBLICATIONS

Anonymous, "Visual Architect: Product Announcement", text copy downloaded from: http://wireless.eic.nctu.edu.tw/cadence/pdfs/va.pdf, pp. 1–6 (Jan. 1997).*

Buonanno et al., "Application of a Testing Framework to VHDL Descriptions as Different Abstraction Levels," 1997 IEEE International Conference on Computer Design: VLSI in Computers and Processors, Oct. 1997, pp. 654–659.

Camposano, R., "From Behavior to Structure: High Level Synthesis," IEEE Design & Test of Computers, Oct. 1990, pp. 8–19.

Fuhrman, Thomas E., "Industrial Extensions to University High Level Synthesis Tools: Making it work in the real world," Proceedings of the 28th Conference on ACM/IEEE design Automation Conference, Jun. 1991, pp. 520–525.

Ly, T.A., "Applying Simulated Evolution to High Level Synthesis," IEEE Transaction on Computer–Aided Design of Integrated Circuits and Systems, Mar. 1993, pp. 389–409.

Ly et al., "Scheduling Using Behavioral Templates," Proceedings of the 32nd ACM/IEEE Design Automation Conference, Jun. 1995, pp. 101–106.

McFarland, Michael et al., "The High–Level Synthesis of Digital Systems," Proceedings of the IEEE, vol 78, No. 2, Feb. 1990, pp. 301–318.

Park, N., et al., "Sehwa: A Software Package for Synthesis of Pipelines from Behavioral Specifications," IEEE Transactions on Computer–Aided Design of Integrated Circuits and Systems, Mar. 1988, pp. 356–370.

Patel, M.R.K., "A Design Representation for High Level Synthesis," Proceedings of the European Design Automation Conference, Mar. 1990, pp. 374–379.

Perkowski, Marek et al., "Diades, A High Level Synthesis System," IEEE International Symposium on Circuits and Systems, May 1989, pp. 1895–1898.

Shirai, K., "A Design System for Special Purpose Processors Based on Architectures for Distributed Processing," Proceedings of the Design Automation Conference, Sep. 1995, pp. 380–385.

Thomas, D.E., "The System Architect's Workbench," Proceedings of the 25th Design Automation Conference, Jun. 1988, pp. 337–343.

Walker, R.A. et al., "Behavioral Transformation for Algorithmic Level IC Design," IEEE Transactions on Computer–Aided Design of Integrated Circuits and Systems, Oct. 1989, pp. 1115–1128.

Walker, Robert et al., "Increasing User Interaction During High Level Synthesis," Proceedings of the 24th Annual International Symposium on Microarchitecture, Nov. 1991, pp. 133–142.

Camposano, Raul, et al., "Synthesizing Circuits From Behavioral Descriptions," IEEE Transactions on Computer–Aided Design, vol. 8, No. 2, Feb. 1989, pp. 171–180.

* cited by examiner

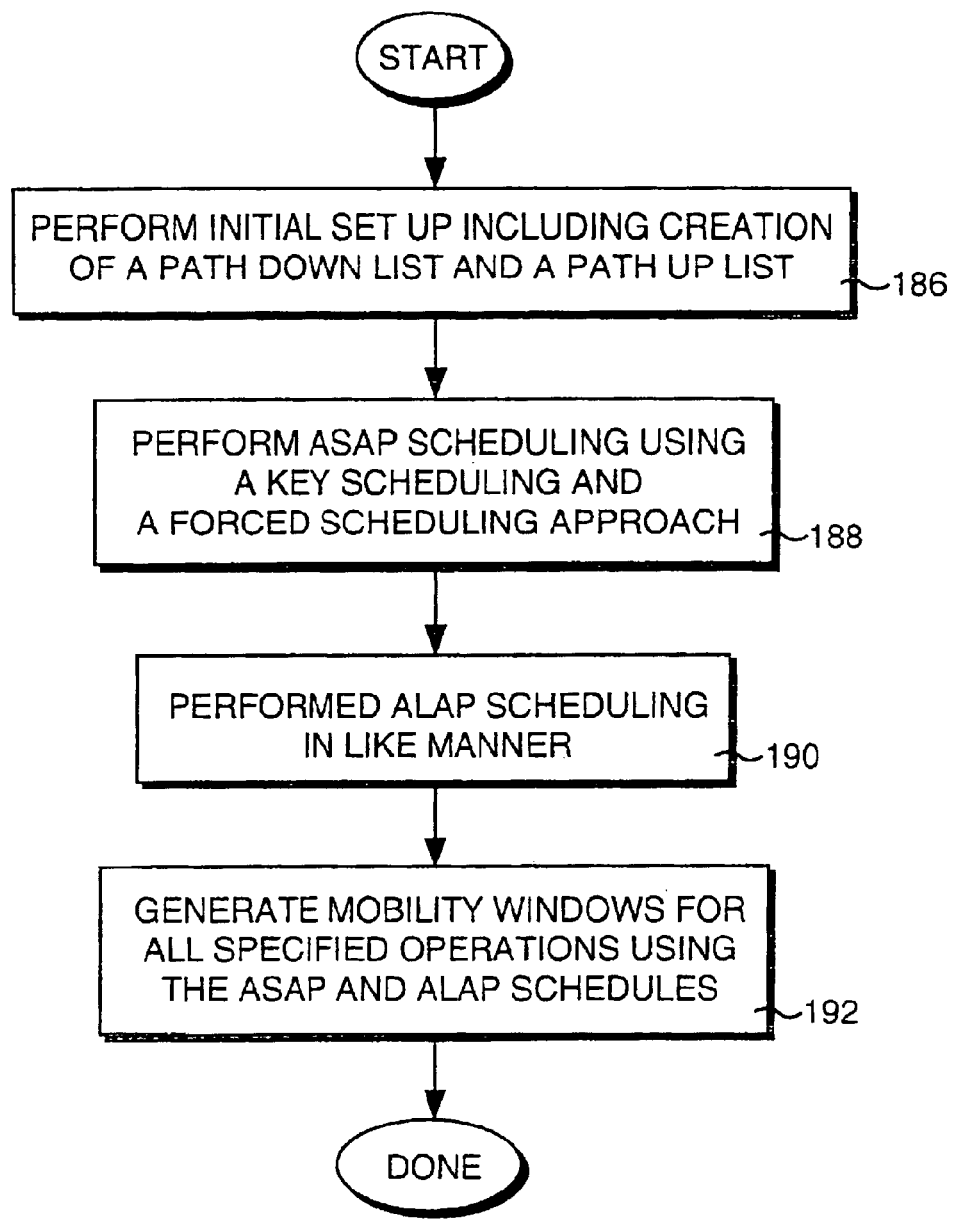

FACILITATING GUIDANCE PROVISION FOR AN ARCHITECTURAL EXPLORATION BASED DESIGN CREATION PROCESS

BACKGROUND OF THE INVENTION

1. Field of the Invention

The present invention relates to the field of electronic design. More specifically, the present invention relates to design creation tools for use by electronic designers to create designs for electronic components, including in particular, integrated electronic components.

2. Background Information

Assisting electronic designers in dealing with the ever increasing complexity of electronic designs (hereinafter, most of the time, simply designs) has long been a recognized need. In the last two decades, the electronic design automation (EDA) tool industry has grown into a multi-billion dollar industry, with a wide range of tools available from an array of manufacturers covering design activities from the beginning to the end of the design cycle.

In the area of design creation, various synthesis tools were introduced in the mid-'80s to assist the designers. These early synthesis tools (which are still in use today) operate at a relatively low level, allowing the designers to specify and optimize the designs at the logic level, also referred to as the gate level. As the complexity of integrated electronic components continued to increase, merely being able to optimize designs at the logic or gate level was no longer sufficient for the designers. A more productive approach was desired. In the late '80s, a new generation of improved synthesis tools became available. These new improved synthesis tools (which have now become the primary design creation tools) are capable of operating at a higher level, allowing the designers to specify and optimize designs at the register transfer level (RTL) as well as at the logic or gate level.

Since then, the complexity of integrated electronic components has continued to increase unabated. Merely being able to optimize designs at the RTL has also become insufficient for the designers for many large designs. Once again, another more productive approach was desired. In recent years, a new type of synthesis tool that complements the earlier RTL and logic level synthesis tools has become available. Together, these synthesis tools enable a designer to operate at an even higher level, specifying and optimizing designs at the behavioral level. However, the current generation of complementary behavioral synthesis tools suffer from a number of drawbacks. First of all, they continue to operate with the RTL and/or logic level synthesis tools' "black box" or batch approach. That is, an "optimized" RTL specification (optimized in the judgment of the synthesis tools) is generated for a designer in response to each set of behavioral specification and constraints provided. (The behavioral specification and constraints are jointly specified.) The designer is unable to interact with the intermediate stages of the generation process to inject or apply his/her knowledge in guiding the generation of the "optimal" design. Once generated, if the designer wants to consider different alternatives, the designer must alter the constraints, which are jointly specified with the behavioral specification, and start the whole synthesis process again. For large designs, it is not uncommon to take hours to re-synthesize, even if the re-synthesis is performed on the more powerful high end workstations. Secondly, the current generation of behavioral synthesis tools have relatively limited capacity. Some of these behavioral synthesis tools recommend having designs partitioned into smaller designs that have less than 150 operations and a speed limit of not more 30 clock cycles (also referred to as c-steps). The smaller designs are behaviorally synthesized individually, and then "merged back" together into the "larger" design.

The increase of complexity of integrated electronic components is not expected to plateau any time in the near future. In fact, the very contrary of an even faster rate of increase is expected. Notwithstanding the relatively recent introduction of the behavioral synthesis tools, it is expected that the prior art approaches to creating electronic designs will be unsatisfactory for handling the larger designs in the near future, which will become the "average" designs in the not too distant future. Thus, an even more productive approach to electronic design creation is desired.

SUMMARY OF THE INVENTION

A novel machine implemented method for facilitating provision of guidance for an architectural exploration based electronic design creation process is disclosed. The method includes facilitating interactive exploration of an electronic design by a designer to aid the designer in formulating his/her guidance, and facilitating the designer in interactively providing the formulated guidance.

In one embodiment, facilitation of interactive exploration by the designer include facilitating interactive cross-probing into a number of issues about the electronic design, including generated candidate architectures for the electronic design. In one embodiment, the issues available for cross probing include inter-dependencies of data and mobility of operations of the design, as well as occupation of hardware resources for the generated candidate architectures.

In one embodiment, Gantt diagrams are employed to facilitate navigation by the designer in exploring design alternatives guided by interactive cross probing. Gantt diagrams graphically representing the generated candidate architectures are selectively presented to the designer. Data dependencies may be graphically depicted on the Gantt diagrams. Additionally, various aspects of the generated candidate architectures may be correlated back to the behavioral specification and/or constraints of the electronic design for the designer.

In one embodiment, the designer may also modify the constraints on the electronic design interactively, applying the information the designer learned through the interactive exploration.

In one embodiment, the method is implemented with executable programming instructions, wherein when executed, enable the executing processor to practice the method. In one embodiment, the programming instructions are incorporated into an EDA tool. The EDA tool, including the incorporated programming instructions, is embodied in a distribution storage medium, for use to distribute and install the EDA tool onto one or more computer systems.

BRIEF DESCRIPTION OF DRAWINGS

The present invention will be described by way of exemplary embodiments, but not limitations, illustrated in the accompanying drawings in which like references denote similar elements, and in which:

FIGS. 6a–6c illustrate one embodiment each of the operational flow of the resource allocation and the resource scheduling transformations suitable for use by candidate architectures generator.

NOMENCLATURE

Before proceeding to the detailed description, it should be noted that similar to the introductory materials presented thus far, the detailed description will be presented in terms commonly employed by those skilled in the art of EDA to convey the substance of their work to others skilled in the same art. These terms include synthesis terminology such as logic level, register transfer level, behavioral level, behavioral synthesis and so forth, and data processing terminology such as instructions, data structures, links, and the like. These terms are well understood by those skilled in the art. In particular, the fact that the various quantities and operations referenced take the form of electrical, magnetic, or optical signals, being stored, transferred, and otherwise manipulated through mechanical, electrical and/or optical components of data processing systems, is known to the artesians. The term data processing systems as used herein includes general purpose as well as special purpose machines, computers, and the like, that are standalone, adjunct or embedded.

DETAILED DESCRIPTION OF THE INVENTION

Figure 1:
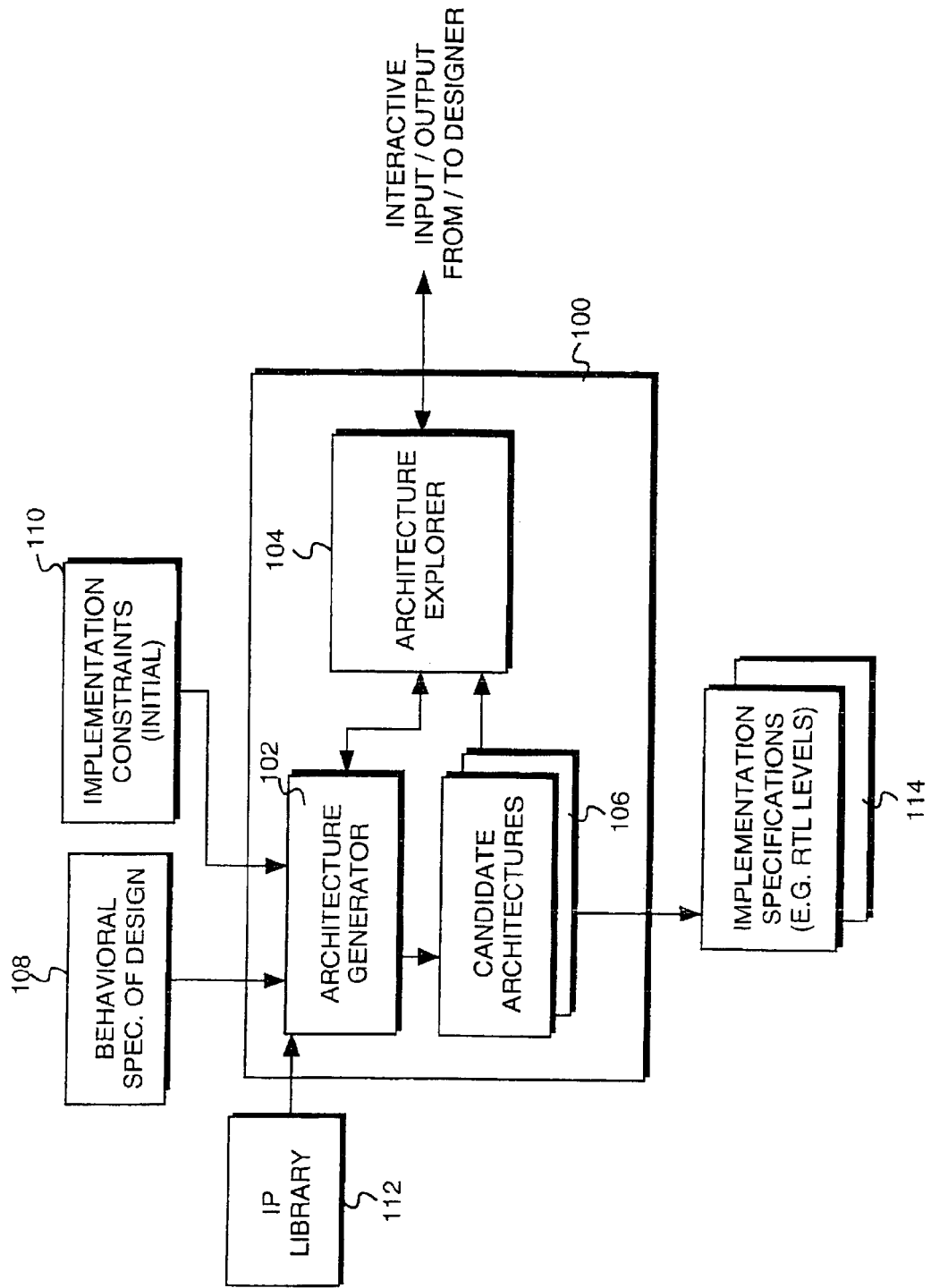
FIG. 1 illustrates an overview of the present invention, including one embodiment of the architecture generator/explorer of the present invention.

Referring now to FIG. 1, wherein a block diagram illustrating an overview of the present invention, including in particular one embodiment of architecture generator/explorer 100 of the present invention, is shown. As illustrated, implementation specifications 114 of a design are advantageously created through a novel architectural exploration based process of the present invention, using architecture generator/explorer 100 of the present invention to evolutionarily generate candidate architectures 106 for the design under the periodic guidance of a designer (not shown), from which implementation specifications 114 are ultimately created. For the illustrated embodiment, implementation specifications 114 are RTL specifications, and the evolutionarily generated candidate architectures 106 are generated at different abstraction levels, with candidate architectures 106 of the lower abstraction levels having progressively more details. Under the present invention, architecture generator/explorer 100 is also used to assist the designer in formulating his/her guidance, by facilitating interactive exploration of the design, by the designer, including interactive exploration of generated candidate architectures 106. Furthermore, architecture generator/explorer 100 is also used to facilitate periodic interactive provision of guidance by the designer to the evolutionary generation of candidate architectures 106 that ultimately lead to the desired end products of implementation specifications 114.

For the purpose of this description, an architecture is a definition of a collection of hardware resources, including assignment of specified operations of the design to the hardware resources, and to particular clock cycles. Whereas, the abstraction levels differ in the details and specificity of the hardware resources, which specified operations are specifically assigned to a particular hardware resource, their usage schedule, and their control.

As will be readily apparent from the description to follow, the advantageous manner of creating implementation specifications 114 for the design allows the designer to operate and optimize the design at a higher level of abstraction than otherwise possible under conventional behavioral and RTL synthesis of the prior art. Furthermore, the advantageous manner of creating implementation specifications 114 for the design allows the designer to explore design alternatives guided by interactively cross probing into various issues of the design and/or selected ones of generated candidate architectures 106 that are of interest to the designer, at selected ones of the intermediate stages of the behavioral and RTL synthesis process, and inject his/her expertise and knowledge at these intermediate stages to change design constraints and regenerate candidate architectures at any level of abstractions, which are not possible under the prior art.

The remaining description will describe the present invention, including architecture generator/explorer 100 in detail, in a manner that is most instrumental in facilitating understanding by those skilled in the art. Various details will be set forth, however, they should not be construed as being restrictive on the present invention. In particular, various tasks will be described in turn as discrete steps, and the order of description should not be construed as being restrictive on the order these tasks are performed. On the other hand, other details and/or well known concepts will be omitted, so as not to obscure the present invention.

Continuing to refer to FIG. 1, for the illustrated embodiment, architecture generator/explorer 100 includes architecture generator 102 and architecture explorer 104. Architecture generator 102 is used repeatedly to perform the earlier described evolutionarily generation of candidate architectures 106 of different abstraction levels for a design. Whereas, architecture explorer 104 is used periodically to facilitate the earlier described interactive explorations of the design by a designer, including the earlier described interactive exploration of generated candidate architectures 106, and to facilitate interactive provision of guidance by the designer to the evolutionary generation of candidate architectures 106. Together, they enable implementation specifications 114 to be generated for a design under the novel architectural exploration based design creation process of the present invention, achieving various advantages including the advantages described earlier.

In accordance with the present invention, architecture generator 102 is first employed to generate initial candidate architectures 106 at a top abstraction level. Architecture generator 102 is then employed, under the guidance of the designer, to generate candidate architectures 106 at the lower abstraction levels. However, before proceeding to generate candidate architectures 106 at the lower abstraction levels, architecture generator 102 may also be employed, at the discretion of the designer, to additionally generate more candidate architectures 106, in addition to the initial ones, at the top abstraction level. In fact, at any point in time during the evolutionary generation of candidate architectures 106, architecture generator 102 may be employed, at the discretion and under the guidance of the designer, to generate and/or regenerate candidate architectures 106 of any abstraction level.

Architecture generator 102 generates candidate architectures 106 at the top abstraction level, using hardware resources available from IP library 112, in accordance with behavioral specification 108, subject to implementation constraints 110. IP library 112 defines all hardware resources available for use for the synthesis process. Behavioral specification 108 defines the design to be synthesized, formally describing the design at an algorithmic level, using for example one of the known hardware description languages (HDL), such as VHDL or Verilog. In accordance with the present invention, unlike any of the prior art synthesis approaches, implementation constraints 110 separately and independently describe an initial set of constraints on the design to be synthesized. Additionally, constraints 110 may be timing, resource as well as sharing constraints. Furthermore, for the illustrated embodiment, candidate architectures 106 at the top abstraction level already include performance of an initial de-abstraction transformation on the input information.

Subsequent candidate architectures 106 of lower abstraction levels are evolutionarily generated by performing further de-abstraction transformations on candidate architectures 106 of immediately higher abstraction levels, subject to the current state of the constraints at the time of generation. The current state of the constraints is the latest modified state of the constraints. Modification of the constraints are made by the designer as desired, while interactively exploring the design and/or selected ones of generated candidate architectures 106, to be described in more detail below. Obviously, the designer may proceed with generation of candidate architectures 106 of any abstraction level without modifying the constraints.

In one embodiment, the de-abstraction transformations include resource allocation, a resource scheduling, finite state machine (FSM) extraction, and resource binding and resource sharing, to evolutionarily generate candidate architectures 106 at the top or first abstraction level, a second, a third, and a fourth lower abstraction level, which will also be referred to as the "allocated", "scheduled", "FSM extracted" and "bound and shared" abstraction levels, to be described more fully below. In one embodiment, each of these de-abstraction transformations is performed in "real time". Experience has shown that candidate architectures for "medium" designs in the order of 500–700 operations may be generated in the order of seconds, depending on the number of constraints and c-steps, whereas candidate architectures for "large" designs in the order of 1500–2000 operations may be generated in the order of minutes, depending also on the number of constraints and c-steps. Thus, the present invention also offers significant increase in the ability handle "large" designs.

Architecture explorer 104 facilitates periodic interactive explorations of the design, including generated ones of candidate architectures 106, to aid the designer in formulating his/her guidance to the evolutionary generation of candidate architectures 106. For the illustrated embodiment, facilitation of periodic interactive exploration includes facilitation of periodic interactive cross probing into various issues/aspects of the design and/or selected ones of generated candidate architectures 106 that are of interest to the designer. Examples of these issues/aspects are data dependencies, operation bottlenecks, etc., to be more fully described below. As described earlier, architecture explorer 104 also facilitates periodic interactive provision of guidance by the designer, which for the illustrated embodiment, includes periodic interactive modification of the constraints on the design. Thus, architecture explorer 104 enables the designer to intervene and inject his/her expertise/knowledge as well as information learned from the explorations to control the evolutionary generation of candidate architectures 106 by architecture generator 102, which ultimately lead to the end product implementation specifications 114 of the design.

Behavioral specification 108, implementation constraints 110 (except for the requirement of separately and independently described), IP library 112 and implementation specifications 114 are all known in the art, and accordingly will not be further described. Architecture generator 102, architecture explorer 104 and candidate architectures 106 will be described in more details below. From the description below, it will be apparent that architecture generator 102 and architecture explorer 104 may be implemented in any one of a number of programming languages known in the art, such as the C++ programming language, and candidate architectures 106 may be implemented in any one of a number of data structures known in the art.

Figure 2:
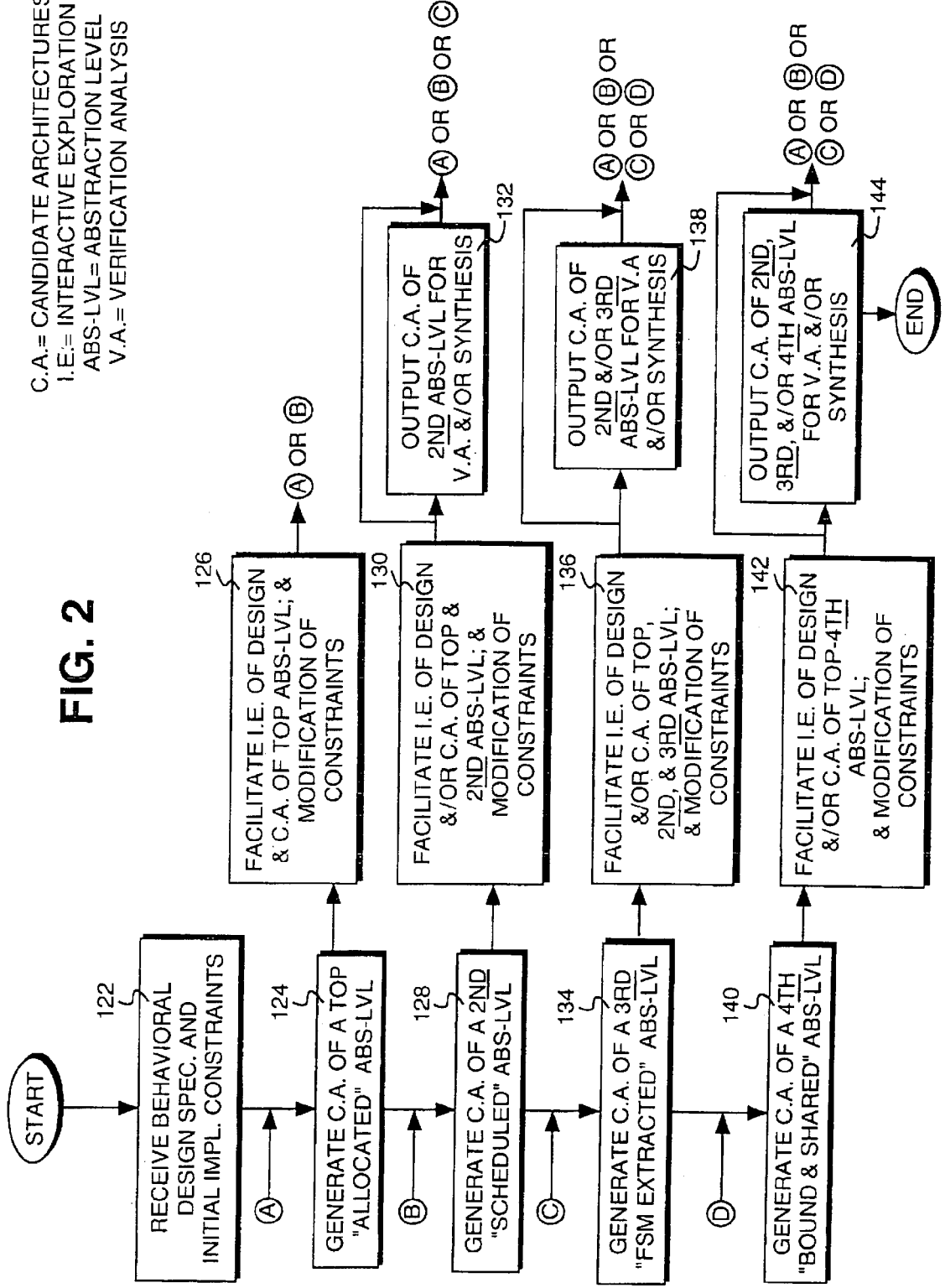
FIG. 2 illustrates one embodiment of the operational flow of the architectural exploration based design creation process of the present invention.

Referring now to FIG. 2, wherein a flow diagram illustrating one embodiment of the architectural exploration based design creation process of the present invention is shown. For the illustrated embodiment, the architectural exploration based design creation process employs candidate architectures 106 evolutionarily generated at four abstraction levels, through incremental performance of four de-abstraction transformations. The four abstraction levels and the four incrementally performed de-abstraction transformations are (a) a top or first "allocated" abstraction level generated through a resource allocation transformation, (b) a second "scheduled" abstraction level generated through an incrementally performed resource scheduling transformation, (c) a third "FSM extracted" abstraction level generated through an incrementally performed FSM extraction transformation, and (d) a fourth "bound and shared" abstraction level generated through an incrementally performed resource binding and resource sharing transformation.

Each resource allocation transformation allocates specified operations of the design to hardware resources of a particular type available from IP library 112. Each resource scheduling transformation assigns specified operations of the design to clock cycles. Each FSM extraction transformation synthesizes a finite state machine to control datapath resources. Finally, each resource binding and resource sharing transformation binds the specified operations of the design to specific hardware resources, and optimizes usage of the hardware resources, causing operations assigned to a like type of hardware resources, but performed in different clock cycles or located in a "disjointed" portion of the design, to share the same common hardware resources.

At step 122, the designer provides behavioral specification 108 of the design, and initial independently specified implementation constraints 110 on the design to architecture generator 102. Recall that constraints 110 may be timing, resource, as well as sharing constraints. In response, architecture generator 102 generates initial candidate architectures 106 at the top or first "allocated" abstraction level for the design in accordance with the received behavioral specification 108 and initial implementation constraints 110, step 124.

In one embodiment, architecture generator 102 generates two initial candidate architectures, a first candidate architecture with the fastest operating speed, and a second candidate architecture with the smallest implementation size. As those skilled in the art will appreciate, the architecture with the fastest operating speed typically has the largest implementation size, as the improved performance is often achieved by providing duplicate resources to facilitate as many parallel operations as possible, whereas the architecture with the smallest implementation size typically has the slowest operating speed, as the reduction in space is often achieved by providing as little resources as possible, resulting in operations having to wait for the availability of the limited resources. Thus, the two initial candidate architectures provide two useful starting points for the designer to guide the remaining evolutionary design creation process. In alternate embodiments, more or less initial candidate architectures at the top abstraction level may be initially generated instead.

Upon generating the initial candidate architectures, architecture explorer 104, at the discretion and direction of the designer, presents a selected one of the initial candidate architectures for interactive exploration by the designer, step 126. As alluded to earlier, these interactive explorations may include interactive cross probing into various issues/aspects of the design and/or the generated candidate architectures that are of interest to the designer. These interactive cross probing may include for example determining data dependency of the design, viewing data flow graph and/or control flow graph of the design, determining bottlenecks and mobility of the specified operations of the design, and so forth. The interactive cross probing may also include for example determining hardware resource occupation of selected ones of the generated candidate architectures. The interactive cross probing may also include correlating various issues/aspects back to behavioral specification 108, and/or implementation constraints 110 of the design. In the course of interactively exploring the design and/or the candidate architectures, the designer may decide to "discard" selected ones of the generated candidate architectures (in other words, without directing further de-abstraction for the particular generated candidate architectures), modify the constraints before further de-abstraction, or proceed with further de-abstraction without making any modification to the constraints. Modification of any of the three types of constraints may include addition of new constraints, deletion of existing constraints, as well as modification of existing constraints.

At the end of step 126, the designer may elect to continue the process at step 124 or step 128, i.e. generating/re-generating candidate architectures 106 at the top "allocated" abstraction level, or proceed with further de-abstraction to generate candidate architectures 106 at the second "scheduled" abstraction level. If the designer elects to continue at step 124, then steps 124–126 are repeated as described earlier.

If the designer decides to proceed with step 128, in response, architecture generator 102 generates candidate architectures 106 at the second "scheduled" abstraction level for selected ones of the candidate architectures at the top "allocated" abstraction level, designated by the designer. Recall from earlier description, architecture generator 102 generates candidate architectures 106 at the second "scheduled" abstraction level by incrementally performing the resource scheduling transformation on the selected ones of the candidate architectures at the top "allocated" abstraction level. At step 130, at the discretion and under the direction of the designer, architecture explorer 104 presents selected ones of the previously as well as the newly generated candidate architectures of the top and second abstraction levels for the designer to explore. The designer explores the design and the presented candidate architectures as described earlier.

At the end of step 130, the designer may elect to continue the process at step 124, step 128, or step 134, i.e. generating/re-generating candidate architectures 106 at the top "allocated" and second "scheduled" abstraction levels, or proceed with further de-abstraction to generate candidate architectures 106 at the third "FSM extracted" abstraction level. Additionally, for the illustrated embodiment, the designer may also have selected ones of candidate architectures 106 at the second "scheduled" abstraction level be output as RTL specifications with implicit FSM for verification analysis, such as, simulation, and/or synthesis, step 132, before continuing with either step 124, step 128 or step 134. If the designer elects to continue at either step 124 or step 128, then steps 124–130 are repeated as described earlier.

If the designer decides to proceed with step 134, in response, architecture generator 102 generates candidate architectures 106 at the third "FSM extracted" abstraction level for selected ones of the candidate architectures at the second "scheduled" abstraction level, designated by the designer. Recall from earlier description, architecture generator 102 generates candidate architectures 106 at the third "FSM extracted" abstraction level by incrementally performing the FSM extraction transformation on the selected ones of the candidate architectures at the second "scheduled" abstraction level. At step 136, at the discretion and under the direction of the designer, architecture explorer 104 presents selected ones of the previously as well as the newly generated candidate architectures of the top, second and third abstraction levels for the designer to explore. The designer explores the design and the presented candidate architectures as described earlier.

At the end of step 136, the designer may elect to continue the process at step 124, step 128, step 134 or step 140, i.e. generating/reenerating candidate architectures 106 at the top "allocated", second "scheduled", and third "FSM extracted" abstraction levels, or proceed with further de-abstraction to generate candidate architectures 106 at the fourth "bound and shared" abstraction level. Additionally, for the illustrated embodiment, the designer may also have selected ones of candidate architectures 106 at the second "scheduled" or third "FSM extracted" abstraction levels be output as RTL specifications with implicit or explicit FSM for verification analysis, such as, simulation, and/or synthesis, step 138, before continuing with either step 124, step 128, step 134 or step 140. If the designer elects to continue at either step 124, step 128, or step 134, then steps 124–136 are repeated as described earlier.

If the designer decides to proceed with step 140, in response, architecture generator 102 generates candidate architectures 106 at the fourth "bound and shared" abstraction level for selected ones of the candidate architectures at the third "FSM extracted" abstraction level, designated by the designer. Recall from earlier description, architecture generator 102 generates candidate architectures 106 at the fourth "bound and shared" abstraction level by incrementally performing the resource binding and resource sharing transformation on the selected ones of the candidate architectures at the third "FSM extracted" abstraction level. At step 142, at the discretion and under the direction of the designer, architecture explorer 104 presents selected ones of the previously generated and the newly generated candidate architectures of the top, second, third and fourth abstraction levels for the designer to explore. The designer explores the design and the presented candidate architectures as described earlier.

At the end of step 142, the designer may elect to continue the process at step 124, step 128, step 134, step 140, or step 144, i.e. regenerating candidate architectures 106 at the top "allocated", second "scheduled", third "FSM extracted", or fourth "bound and shared" abstraction levels, or output selected ones of the candidate architectures 106 at the lowest three abstraction levels as RTL specifications with implicit or explicit FSM or structural netlist for verification analysis, such as, simulation, and/or synthesis, step 144. At the end of step 144, if the designer is still not fully satisfied with the RTL structural netlist specification 114, the designer may continue the process with either step 124, step 128, step 134 or step 140. If the designer is satisfied with at least one of the RTL structural netlist specifications 114 as the desired end product, the designer terminates the process.

As will be appreciated by those skilled in the art, the above described novel architectural exploration based design creation process provides tremendous flexibility to the designer, allowing the designer to operate at higher abstraction level, and to provide guidance and inject his/her expertise/knowledge at various intermediate stages of the process, which otherwise the designer is unable to do under the prior art approaches. Additionally, by providing for abstraction levels that span "allocated", "scheduled", "FSM extracted" and "bound and shared" abstraction levels, for the first time, a designer may freely operate at these abstraction levels within a single session of a single tool, working with information that are either not available under the prior art, and if available at all, would require the designer to operate with separate tools, i.e. behavioral synthesis tool and RTL synthesis tool. Also, by taking into consideration sharing constraints during resource allocation transformation, for the first time, the designer is able to address sharing constraint issues early in the design cycle, which conventionally are not addressed until late in the RTL level of the design cycle. Furthermore, it should also be noted that, while the architectural exploration based design creation process of the present invention has been described with the above four abstraction level embodiment, the novel design creation process may be practiced with more or less abstraction levels.

Figure 3:
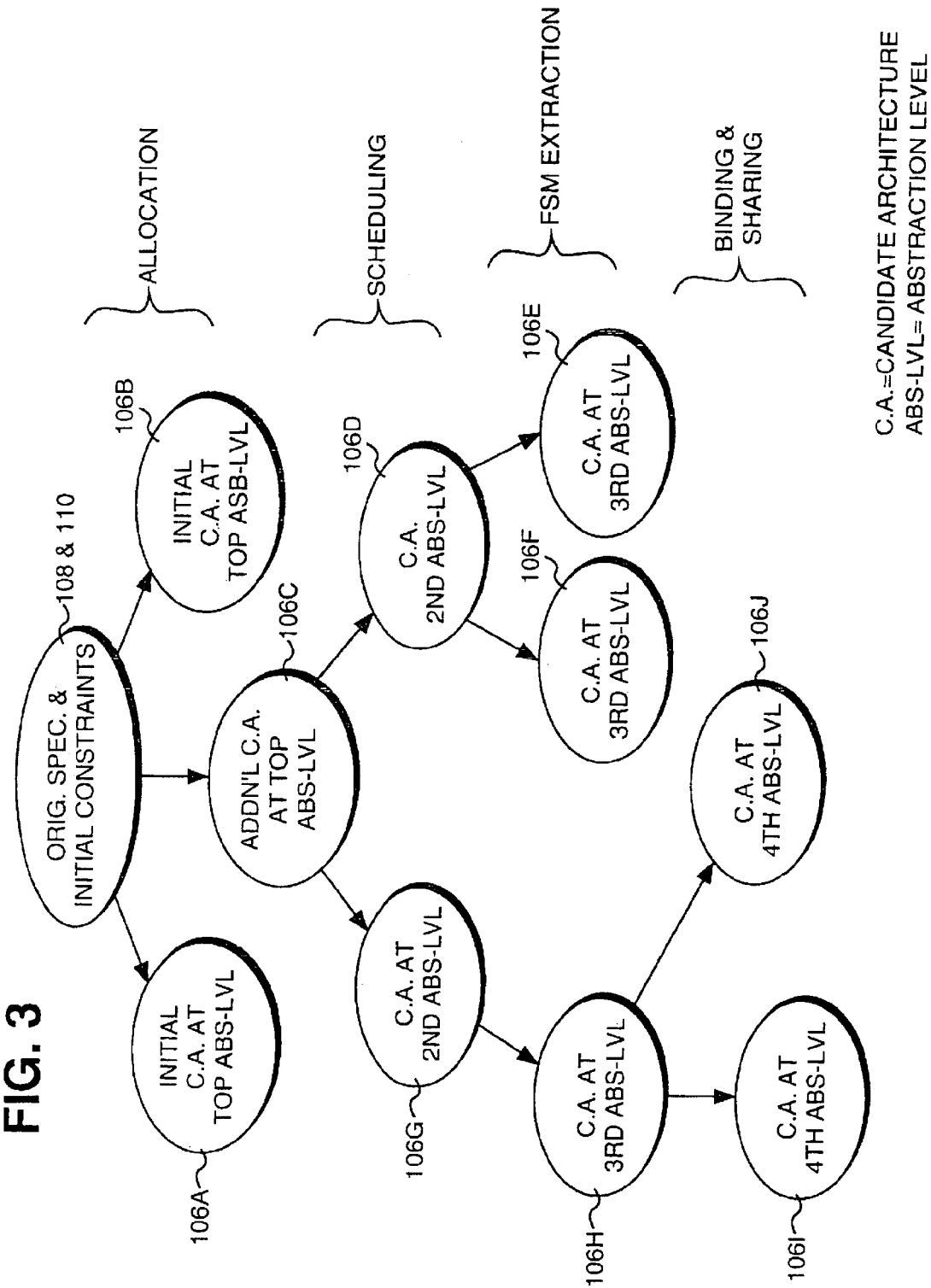
FIG. 3 illustrates an exemplary design creation using architecture generator/explorer of the present invention.

FIG. 3 illustrates an exemplary design creation in accordance with the architectural exploration based design creation process of the present invention to further illustrate the novel design creation process of the present invention. As shown, at the discretion and direction of the designer, from behavioral specification 108 and initial independently described constraints 110, architecture generator 102 generates initial candidate architectures 106a and 106b, a fastest and a smallest implementation as described earlier. After observing both candidate architectures 106a–106b, and using them as guides, the designer causes architecture generator 102 to generate new candidate architectures 106c at the top abstraction level, modifying constraints 110 prior to requesting the additional generation.

After interactively exploring the design and/or candidate architecture 106c, assuming the designer is substantially satisfied with candidate architecture 106c, the designer causes architecture generator 102 to generate candidate architectures 106d at the second abstraction level, with or without modifying the constraints prior to requesting the generation. After interactively exploring the design and/or selected ones of candidate architectures 106c and 106d, again assuming the designer is substantially satisfied with candidate architecture 106d, the designer causes architecture generator 102 to generate candidate architecture 106e at the third abstraction level, with or without modifying the constraints prior to requesting the generation.

After interactively exploring the design and/or selected ones of candidate architectures 106c–106e, assuming the designer is not satisfied with certain aspects of candidate architecture 106e, the designer causes architecture generator 102 to generate candidate architecture 106f at the same third abstraction level, modifying the constraints prior to requesting the generation. After interactively exploring the design and/or selected ones of candidate architectures 106c–106f, assuming the designer is still not satisfied with certain aspects of candidate architecture 106f either, the designer decided to "discard" both candidate architectures 106e and 106f, and causes architecture generator 102 to generate candidate architecture 106g back at the second abstraction level instead, modifying the constraints prior to requesting the generation.

After interactively exploring the design and/or selected ones of candidate architectures 106c and 106g, assuming the designer is substantially satisfied with candidate architecture 106g, the designer causes architecture generator 102 to generate candidate architecture 106h at third abstraction level, with or without modifying the constraints prior to requesting the generation. Then, after interactively exploring the design and/or selected ones of candidate architectures 106c, 106g, and 106h, assuming the designer is substantially satisfied with candidate architecture 106h, the designer causes architecture generator 102 to generate candidate architecture 106i at the fourth abstraction level, with or without modifying the constraints prior to requesting the generation.

After interactively exploring the design and/or selected ones of candidate architectures 106c, 106g, 106h and 1061, assuming the designer is not totally satisfied with candidate architecture 106i, the designer causes architecture generator 102 to generate candidate architecture 106j, modifying the constraints prior to requesting the generation. Then, after interactively exploring the design and/or selected ones of candidate architectures 106c, 106g, 106h and 106j, assuming the designer is satisfied with candidate architectures 106j, the designer causes candidate architecture 106j to be output as the desired end product RTL structural netlist specification 114 for the design.

Thus, the designer is able to provide guidance throughout the various intermediate stages to guide the design creation process to produce the eventual final implementation result desired, which is optimized in the judgment of the designer and not in the judgment of a synthesis tool.

Figure 4:
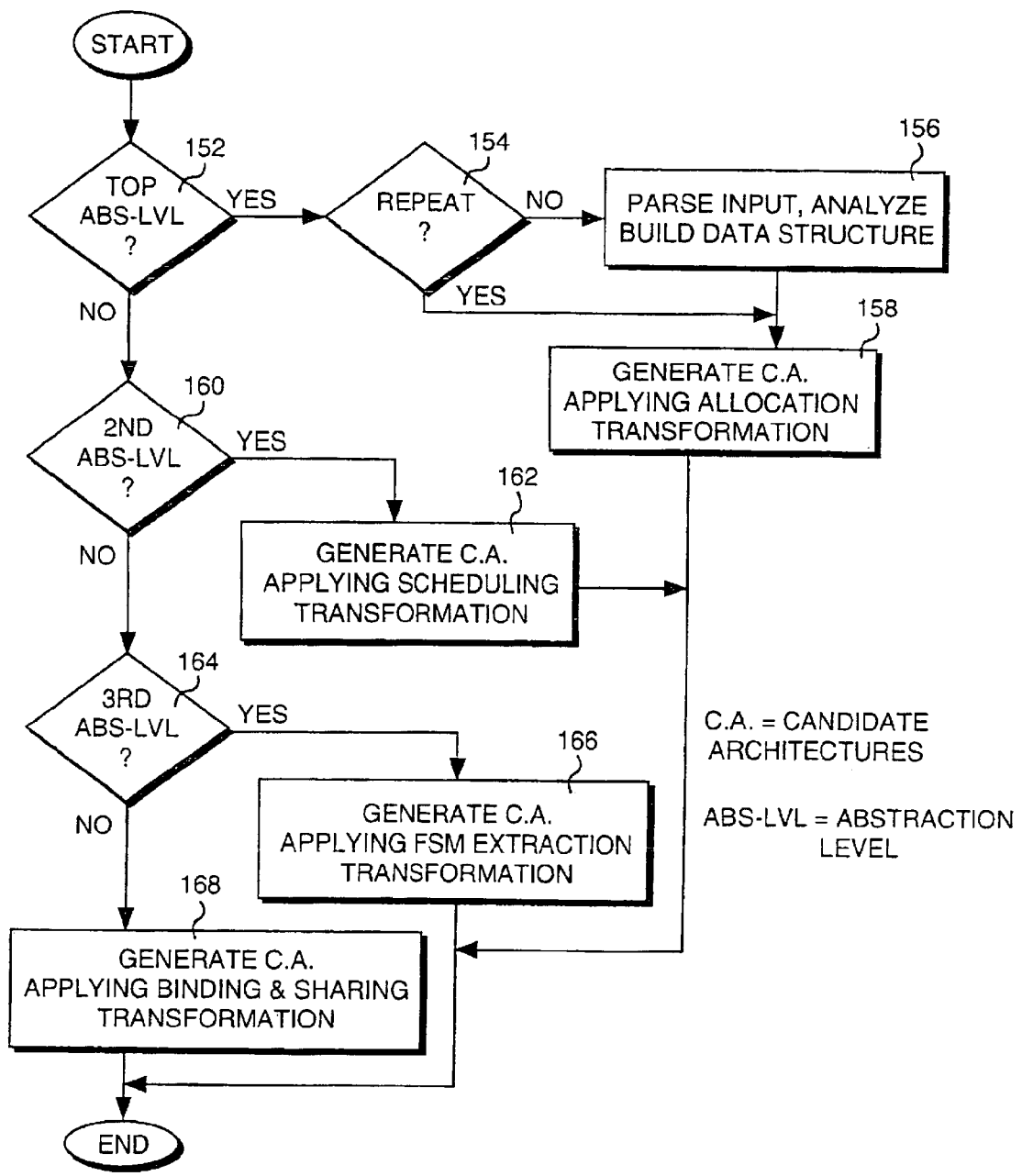
FIG. 4 illustrates one embodiment of the operation flow of architecture generator.

FIG. 4 illustrates the operational flow of one embodiment of architecture generator 102 of the present invention. As illustrated, upon invocation, at step 152, architecture generator 102 determines if the request is to generate a candidate architecture 106 at the top "allocated" level. If the request is to generate a candidate architecture 106 at the top "allocated" level, architecture generator 102 further determines if the request is a first time request for the top "allocated" abstraction level or a repeat request, step 154. If the request is a first time request, architecture generator 102 parses the received behavioral specification 108 and initial constraints 110, analyzes and organizes the information learned from the parsing step, and builds various data structures to hold the organized information, step 156. Then, architecture generator 102 uses the stored information to generate the initial candidate architectures 106, performing the above described resource allocation transformation to de-abstract the input information. Back at step 154, if it is determined that the request is a repeat request, architecture generator 102 proceeds directly to step 158, and uses the previously stored information to generate the additional candidate architectures 106 at the top "allocated" abstraction level.

The parsing, analyzing, organizing, storing and generating steps may be performed using any one of a number of techniques known in the art. Accordingly, these steps will not be further described. Except for certain incorporated teachings in resource allocation transformation, resource allocation transformation, i.e. allocating specified operations of the design to hardware resources of a particular type available from IP library 112 is also generally known and will not be further described. The incorporated teachings, on the other hand, will be further described later with references to FIG. 6*a*.

Back at step 152, if it is determined that the request is not requesting generation of a candidate architecture 106 at the top "allocated" level, architecture generator 102 further determines if the request is a request to generate a candidate architecture 106 for the second "scheduled" abstraction level, step 160. If it is determined that the request is a request to generate a candidate architecture 106 at the second "scheduled" abstraction level, architecture generator 102 proceeds to step 162, and generates the desired candidate architecture 106 at the second "scheduled" abstraction level, performing the resource scheduling transformation on the candidate architecture 106 at the top "allocated" abstraction level designated by the designer.

Similarly, except for certain incorporated inteachings in resource scheduling transformation, resource scheduling transformation, i.e. scheduling specified operations of the design to clock cycles is also generally known, and will not be further described. The incorporated teachings, on the other hand, will be further described later with references to FIG. 6*b*.

Back at step 160, if it is determined that the request is not requesting generation of a candidate architecture at the second "scheduled" level either, architecture generator 102 further determines if the request is a request to generate a candidate architecture 106 for the third "FSM extracted" abstraction level, step 164. If it is determined that the request is a request to generate a candidate architecture 106 at the third "FSM extracted" abstraction level, architecture generator 102 proceeds to step 166, and generates the desired candidate architecture 106 at the third "FSM extracted" abstraction level, performing the FSM extraction transformation on the candidate architecture 106 at the second "scheduled" abstraction level designated by the designer. FSM extraction transformation, i.e. extracting a FSM to control datapath resources, is known in the art, and will not be further described.

Back at step 164, if it is determined that the request is not requesting generation of a candidate architecture 106 at the third "FSM extracted" level either, architecture generator 102 proceeds to step 168, and generates the desired candidate architecture 106 at the fourth "bound and shared" abstraction level, performing the resource binding and resource sharing transformation on the candidate architecture 106 at the third "FSM extracted" abstraction level designated by the designer. Resource binding and resource sharing transformation, i.e. assigning specified operations of the design to specific hardware resources, and optimizing the hardware resource usage, causing specified operations assigned to hardware resources of the same type, but performed in different clock cycles, to share the same common specific hardware resources, is known in the art, and will not be further described.

Similarly, while architecture generator 102 has been described with a four abstraction level embodiment, the present invention may be practiced with the described architecture generator 102 modified to support more or less abstraction levels.

Figure 5:
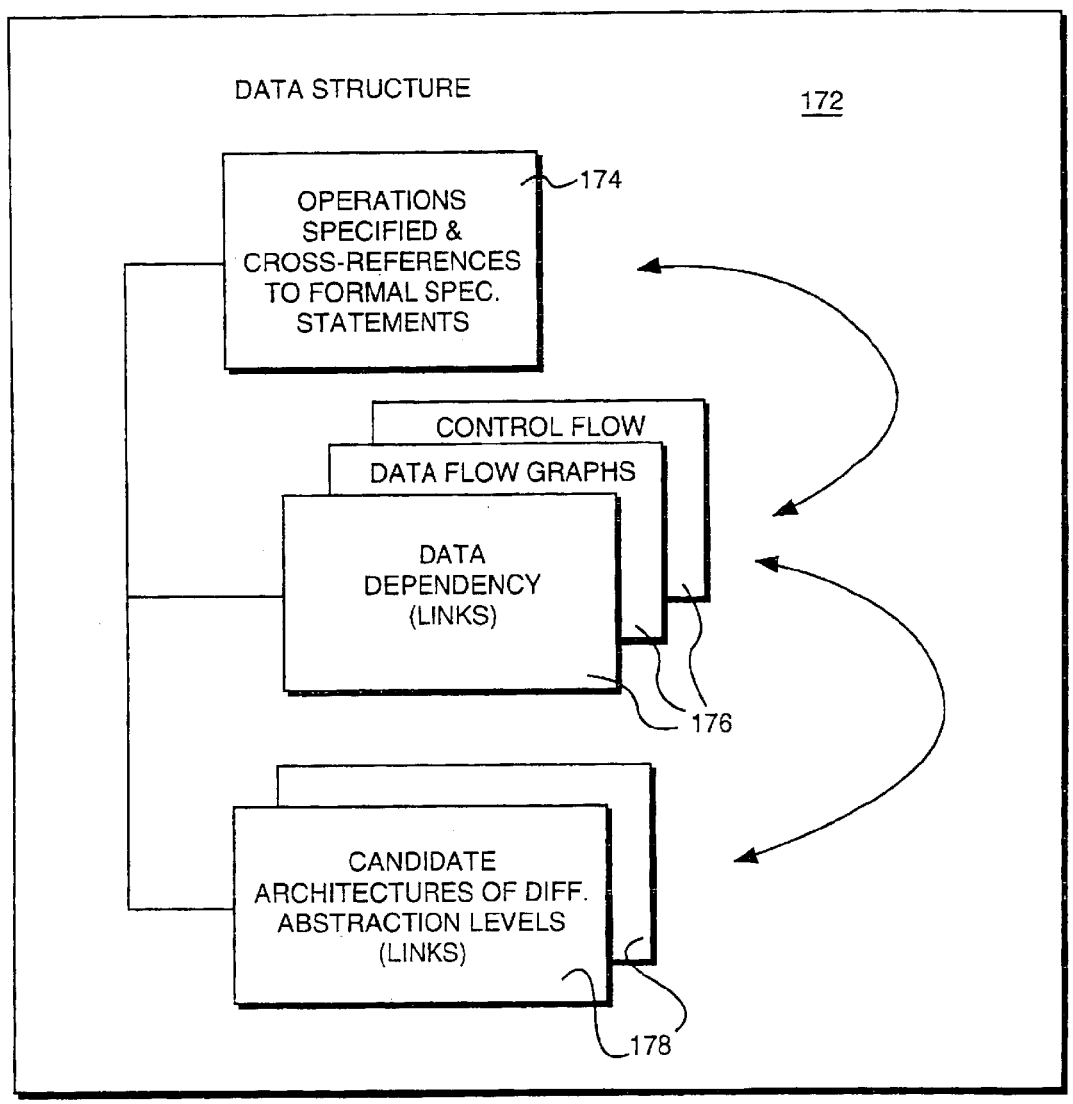
FIG. 5 illustrates an exemplary data structure suitable for use by architecture generator.

FIG. 5 illustrates an exemplary data structure suitable for use by architecture generator 102. Exemplary data structure 172 includes first portion 174 for use to store information about the operations of the design specified by behavioral specification 108, and constraints 110, and second portions 176 for use to store derived descriptive information about the design, such as data dependency between different elements of the design, a data flow graph of the design, a control flow graph of the design, and so forth. Exemplary data structure 172 also includes third portions 178 for use to store the evolutionarily generated candidate architectures 106 of the design. More importantly, each portion 174, 176 and 178 includes the appropriate cross-reference information, linking the various stored information to each other to facilitate cross probing into various issues/aspects of the design and/or selected ones of the generated candidate architectures. The amount of cross references or linking information maintained are application dependent. Clearly, the more cross reference or linking information are maintained, the larger the types and scope of cross probing will be available to the designer. In alternate embodiments, other control information are also included.

Figure 6A:
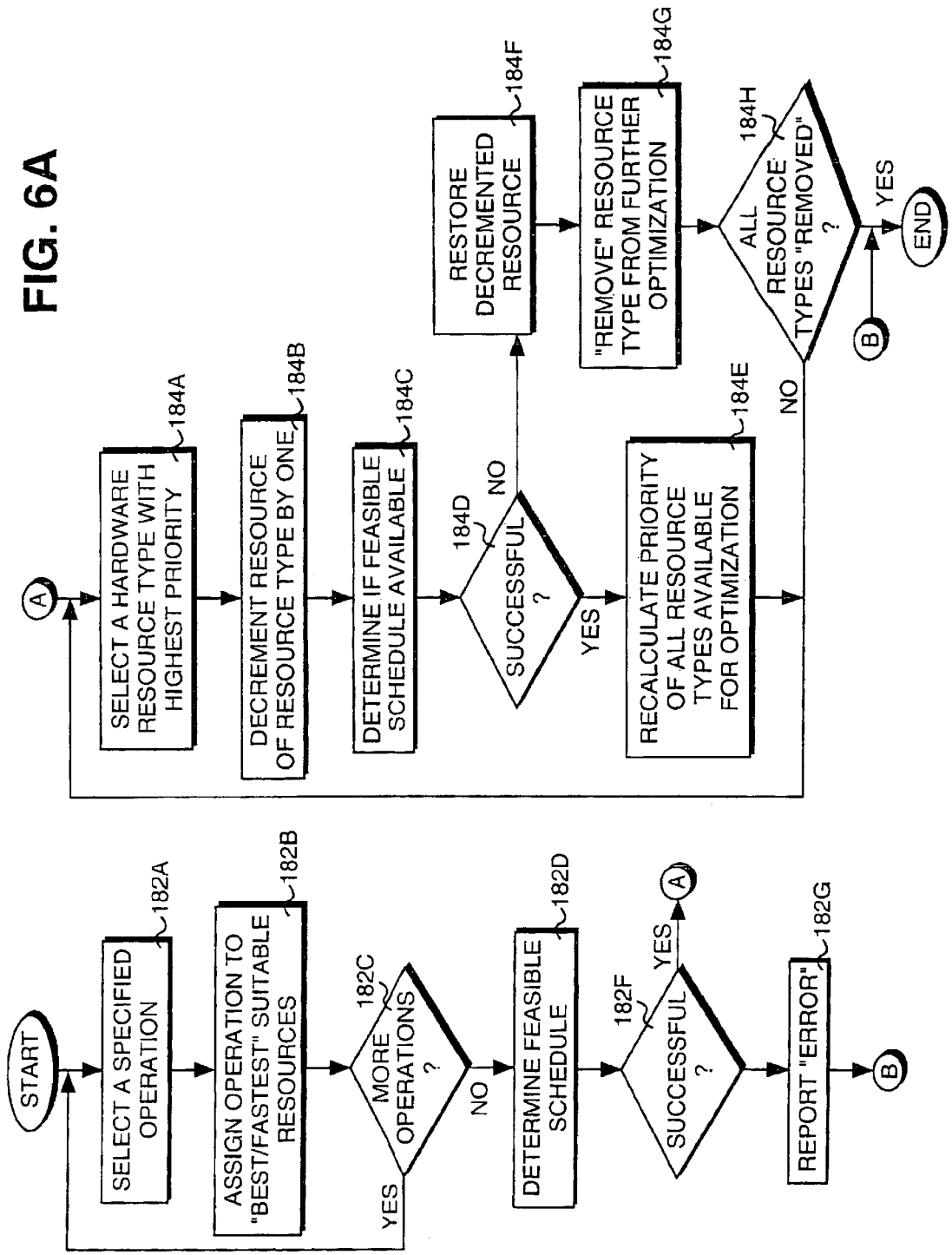
Figure 6C:
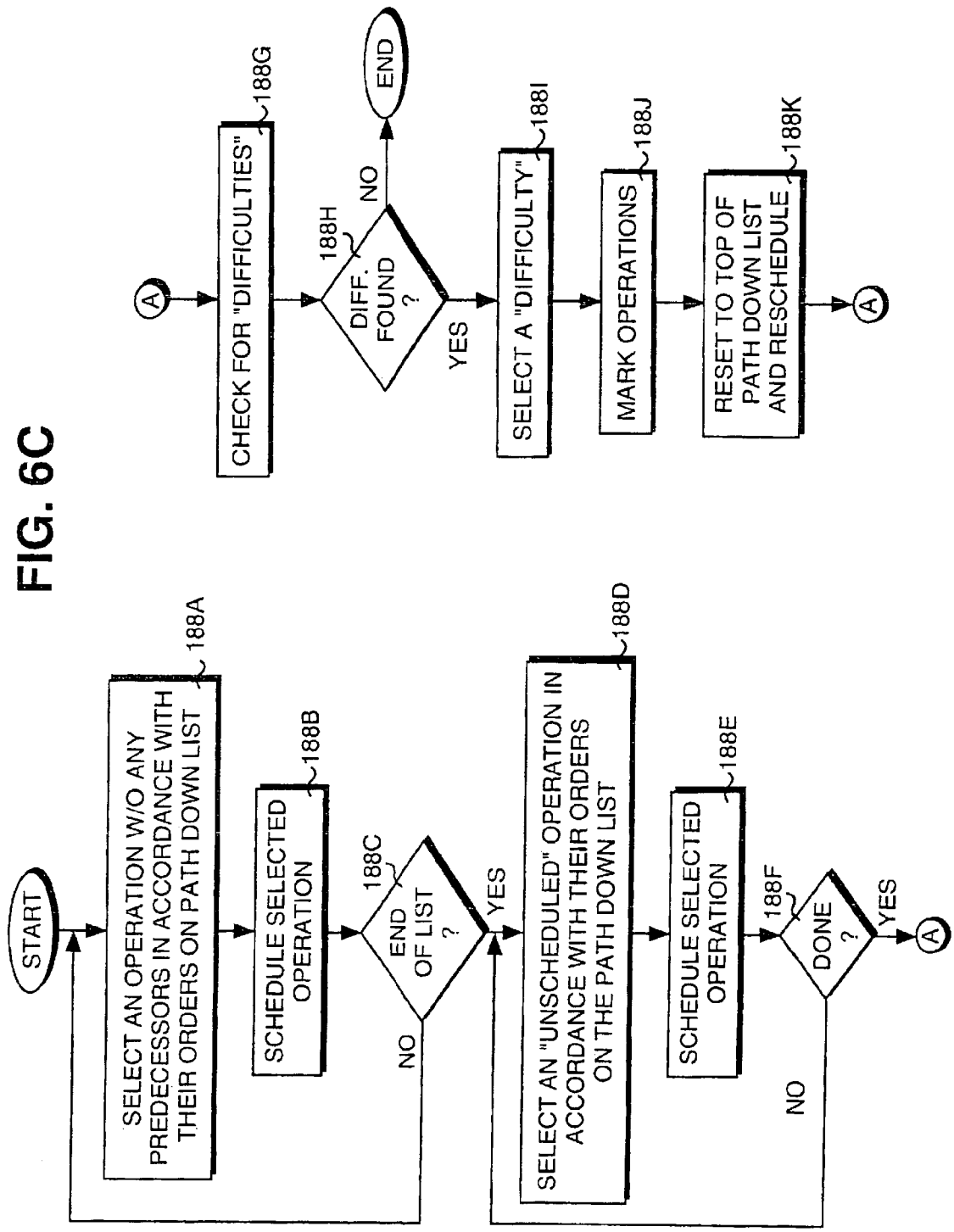

Referring now to FIGS. 6*a*–6*c*, wherein three block diagrams illustrating one embodiment each of a resource allocation and a resource scheduling approach suitable for use by architecture generator 102 to perform resource allocation and resource scheduling de-abstraction transformations are shown. FIG. 6*a* illustrates the resource allocation approach, whereas FIG. 6*b* illustrates the resource scheduling approach. Recall from earlier description that the goal of resource allocation transformation is to assign each specified operation of the design to a hardware resource type, aiming to minimize the total area required to implement the design. For the embodiment illustrated in FIG. 6*a*, the resource allocation approach also tentatively schedules each specified operation to a clock cycle, as well as attempts to select a number of resources for each resource type to "minimize" (as determined by the approach being used) the total area requirement for the implementation, given the resource, timing and sharing constraints stipulated. Recall from earlier description also that the goal of resource scheduling is to schedule each specified operation to a clock cycle. For the embodiment, illustrated in FIG. 6*b*, the resource scheduling approach determines scheduling under an as-soon-as-possible (ASAP) as well as an as-late-as-possible (ALAP) approach. Furthermore, a mobility window for each specified operation is determined, using the schedules generated under the ASAP and ALAP approaches.

As illustrated in FIG. 6*a*, for the illustrated embodiment, resource allocation includes two major groups of steps, steps 182*a*–182*g*, and steps 184*a*–184*h*. Steps 182*a*–182*g* assign a "best/fastest" (as determined by the approach being used) resource to each specified operation, whereas steps 184a–184h attempts to decrease the numbers of resources employed for each resource type as well as to do reassignment to smaller resources where possible to reduce the total area requirement. For the illustrated embodiment, architecture generator 102 loops through steps 182a–182c to assign a "best/fastest" resource to each specified operation. For the illustrated embodiment, the "best/fastest" resource is assigned based on the delay of the resource executing the operation, as well as based on a number of allowed resources for each resource type, and the average demand on the resource type. Then, at step 182d, architecture generator 102 invokes its scheduling portion to determine if a feasible schedule, under the ASAP approach can be generated, to be described more fully below. If such a schedule cannot be generated, architecture generator 102 reports the failure, step 1829, and skips steps 184a–184h.

However, if an ASAP based schedule is feasible, architecture generator 102 proceeds to steps 184a–184h. At step 184a, architecture generator 102 selects a resource type, in accordance with the resource type's relative priority, which may be determined in any one of the priority approaches known in the art. Upon selecting the resource type, architecture generator 102 decrements the amount of resources of the resource type by a predetermined amount, e.g. one, step 184b. Architecture generator 102 invokes its scheduling portion again to determine if an ASAP based schedule is feasible, step 184c. If such a schedule is feasible, step 184d, yes branch, architecture generator 102 recalculates the relative priority of all the resource types, and repeats steps 184a–184d as described earlier.

If such a schedule is not feasible (which eventually will occur), the decremented number of resource(s) of the particular resource type is (are) increased back, step 184f, and the resource type is "removed" from further optimization consideration, step 184g. Architecture generator 102 then determines if there are any resource types left for optimization, step 184h. If not all resource types have been removed from optimization consideration, architecture generator 102 repeats steps 184a–184g, as described earlier, otherwise, architecture generator 102 terminates the resource allocation process.

The above described embodiment is capable of supporting structurally pipelined resource implementations, as well as multi-cycle operations. It is capable of dealing with pipelined implementations with both equal and non-equal stage length. Also it is capable of handling sequential types of resources.

As illustrated in FIG. 6b, for the illustrated embodiment, resource scheduling includes four major steps, steps 186–192. At step 186, preliminary preparations, including at least the creation of a "path-down list" and a "path-up list" are performed. Then, at step 188, ASAP scheduling is performed, for the illustrated embodiment, using two groups of steps, a key scheduling based first group of steps and a forced scheduling based second group of steps. Next, at step 190, ALAP scheduling is performed. Finally, at step 192, a mobility window for each specified operation is determined.

The path-down list is a list of all specified operations in decreasing order based on their "weighted" path length until the bottom of the data flow graph. For every operation, the "weighted" path length is calculated taking into account propagation delays of the operations on the way down the graph, criticalness factors of the resources assigned to the operations located on the way down, and the levels these operations are located in the operation hierarchy. The "weights" employed for each operation are proportional to its delay and a criticalness factor, but inversely proportional to its level in the operation hierarchy; and they are empirically determined. The path-up list is similar to the path-down list, except the operations are in decreasing order based on their "weighted" path length until the top the data flow graph. The path-down list is employed in ASAP scheduling, whereas the path-up list is employed in ALAP scheduling.

FIG. 6c illustrates ASAP scheduling, step 188, in further detail. As alluded to earlier, ASAP scheduling is performed in two groups of steps, using a key scheduling based first step, steps 188a–188f and a forced scheduling based second group of steps, step 188g–188k. For the illustrated embodiment, key scheduling starts with architecture generator 102 scheduling the specified operations with no predecessors first, steps 188a–188b. Architecture generator 102 traverses the path-down list, selecting one operation at a time (those with no predecessors, i.e. those at the first level of the data flow graph), step 188a, and then scheduling the selected operation on the ASAP basis, step 188b. Architecture generator 102 repeats steps 188a–188b until the end of the list is reached, with all operations with no predecessors scheduled on the ASAP basis. If no resources are available to schedule a selected operation (with no predecessors) in a particular control step, the operation will be scheduled for the next earliest control step, that offers the required resources.

Next, architecture generator 102 schedules the remaining operations (those with predecessors), steps 188d–188f. Architecture generator 102 traverses the path-down list, multiple times if necessary, selecting one operation at a time (those unscheduled operations with all predecessors scheduled), step 188d, and then scheduling the selected operation on the ASAP basis, step 188e. Architecture generator 102 repeats steps 188d–188e until all remaining operations (those with predecessors) are scheduled on the ASAP basis. Similarly, if no resources are available to schedule a selected operation (with all predecessor scheduled) in a particular control step, the operation will be scheduled for the next earliest control step, that offers the required resources.

For the illustrated embodiment, the appropriate control step is determined by first identifying the earliest possible control step, in accordance with the data flow precedence constraints. If an assignment to the earliest possible control step cannot be done, an offset forward from the earliest control steps is calculated. To assign an operation to a control step, a resource required by the operation has to be available, and in case of being chained, the operation must not cause a delay longer than the length of a control step. Furthermore, there must not be any other operations with the same output signal already assigned to the same control step.

Upon scheduling all the operations, architecture generator 102 determines if it is necessary to perform forced scheduling, steps 188g–188k. Architecture generator 102 traverses the path-down list, examining the schedule assignments to determine if any "difficulties" were encountered, i.e. if any of the scheduling assignment causes one or more constraints to be violated, step 188g. If a difficulty situation is identified, step 188h, then all impacted operations are selected, step 188I, and "marked" to retain their current assignment, step 188J. Upon marking these operations, architecture generator 102 resets its position on the path-down list and attempts to reschedule other operations around the "marked" operations, step 188k. Steps 188g–188k are repeated multiple times, until it is determined that all difficulties, i.e. constraint violations are resolved. At such time, ASAP scheduling is completed.

ALAP scheduling in step 190 is performed in like manner, except the path-up list is employed instead of the path-down list, and in employing the path-up list, the successors as opposed to the predecessors are examined. Accordingly, it will not be further described. Finally, as described earlier, the scheduling information available from the ASAP and ALAP scheduling are employed to form a mobility window for each specified operation, with the ASAP scheduling information constraining the earliest time of the mobility window, and the ALAP scheduling information constraining the latest time of the mobility window. Such determination is well within the ability of those skilled in the art. Accordingly, determining the mobility window will not be further described either.

Similarly, the above described embodiment for resource scheduling is capable of supporting structurally pipelined resource implementations, as well as multi-cycle operations. It is capable of dealing with pipelined implementations with both equal and non-equal stage length. Also it is capable of handling sequential type of resources.

Figure 7:
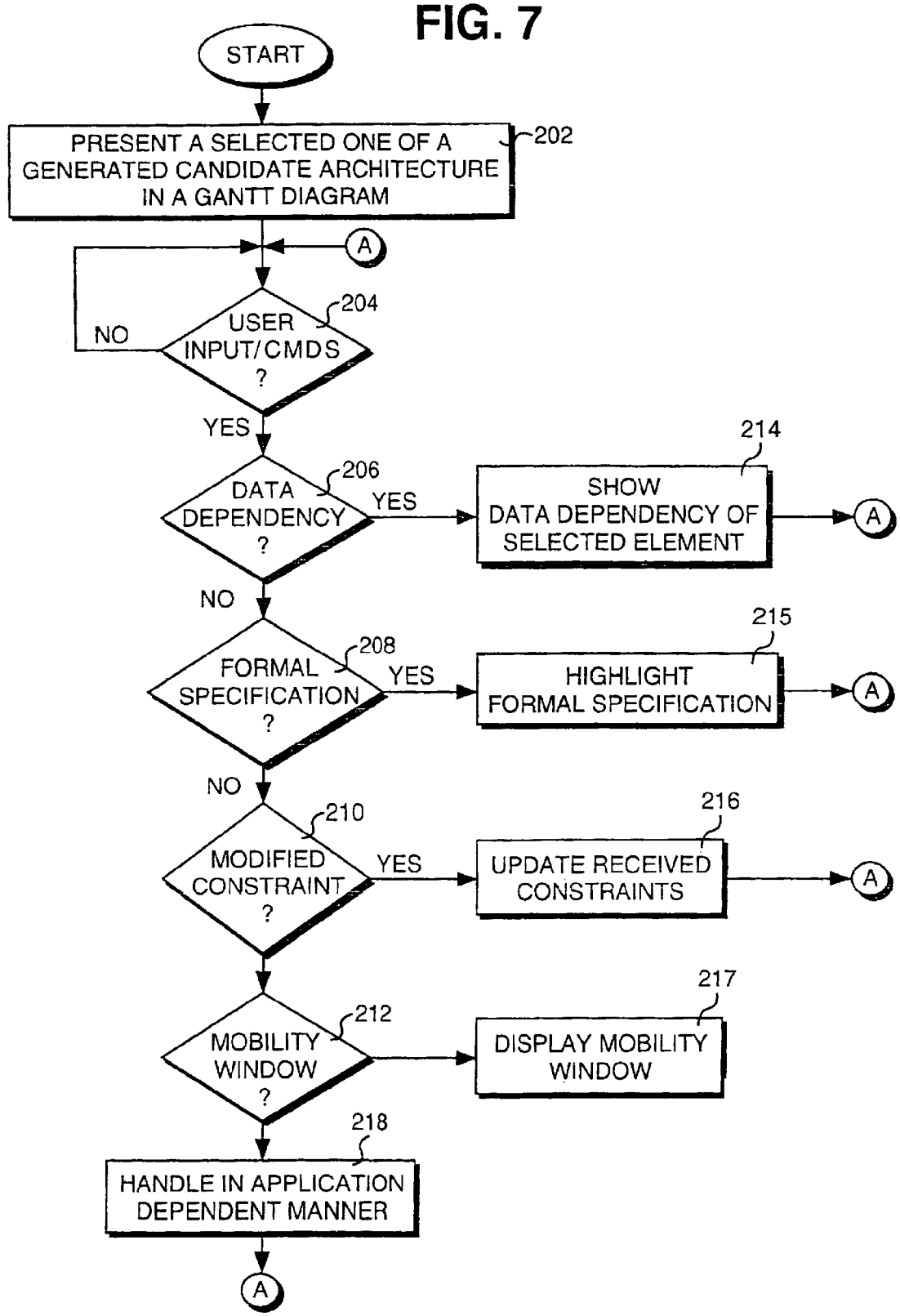
FIG. 7 illustrates one embodiment of the operational flow of architecture explorer for facilitating interactive exploration of a design, including interactive cross probing into various issues by the designer.

FIG. 7 illustrates the operational flow of one embodiment of architecture explorer 104. As illustrated, at step 202, in response to the direction of the designer, architecture explorer 104 presents a selected one of a generated candidate architecture 106 at the second "scheduled" abstraction level in a Gantt diagram representation to facilitate navigation by the designer in performing the above described interactive exploration of design alternatives, guided by cross probing on various issues/aspects of the design, step 202. Upon presenting the Gantt diagram representation of the selected candidate architecture, architecture explorer 104 waits for further instructions from the designer, step 204.

Upon receiving further instructions from the designer, architecture explorer 104 determines the instructions or directives from the designer, steps 206–212, and handles them accordingly, step 214–218. For illustrative purpose, four particular instructions/directives are illustrated. In the case it is determined at step 206 that the designer desires to cross probe into data dependencies of selected data items, architecture explorer 104 displays the data dependencies for the designer, step 214. In one embodiment, the display is effectuated by graphically depicting the data dependencies on the Gantt diagram representation of the selected candidate architecture, to be described more fully below.

Similarly, in the case it is determined at step 208 that the designer desires to cross probe into certain correlation to the original behavior specification 108 and/or constraints 110, architecture explorer 104 displays the correlation of interest for the designer, step 215. In one embodiment, the display is effectuated by highlighting the applicable portions of original behavioral specification 108 and/or constraints 110, to be described more fully below.

Likewise, in the case it is determined at step 210 that the designer desires to modify constraints 110 on the design, architecture explorer 104 facilitates the modification, step 216. In one embodiment, the modification is facilitated through drop down command menus associated with the above described Gantt diagram representation of a selected candidate architecture. Except for the novel association of design constraint modification with Gantt diagram representation of candidate architectures, these end user interface techniques are known. Alternative approaches may be employed though.

Likewise, in the case it is determined at step 210 that the designer desires to examine the mobility windows of specified operations of the design, architecture explorer 104 facilitates the examination, step 217. In one embodiment, the examination is facilitated by depicting the mobility windows on the above described Gantt diagram representation of a selected candidate architecture. Alternative approaches may also be employed. Those skilled in the art will appreciate that numerous other cross probes may be facilitated, consistent with the spirit of the embodiment described. Step 218 is intended to represent all these variations and extensions that are well within the ability of those skilled in the art.

Figure 8:
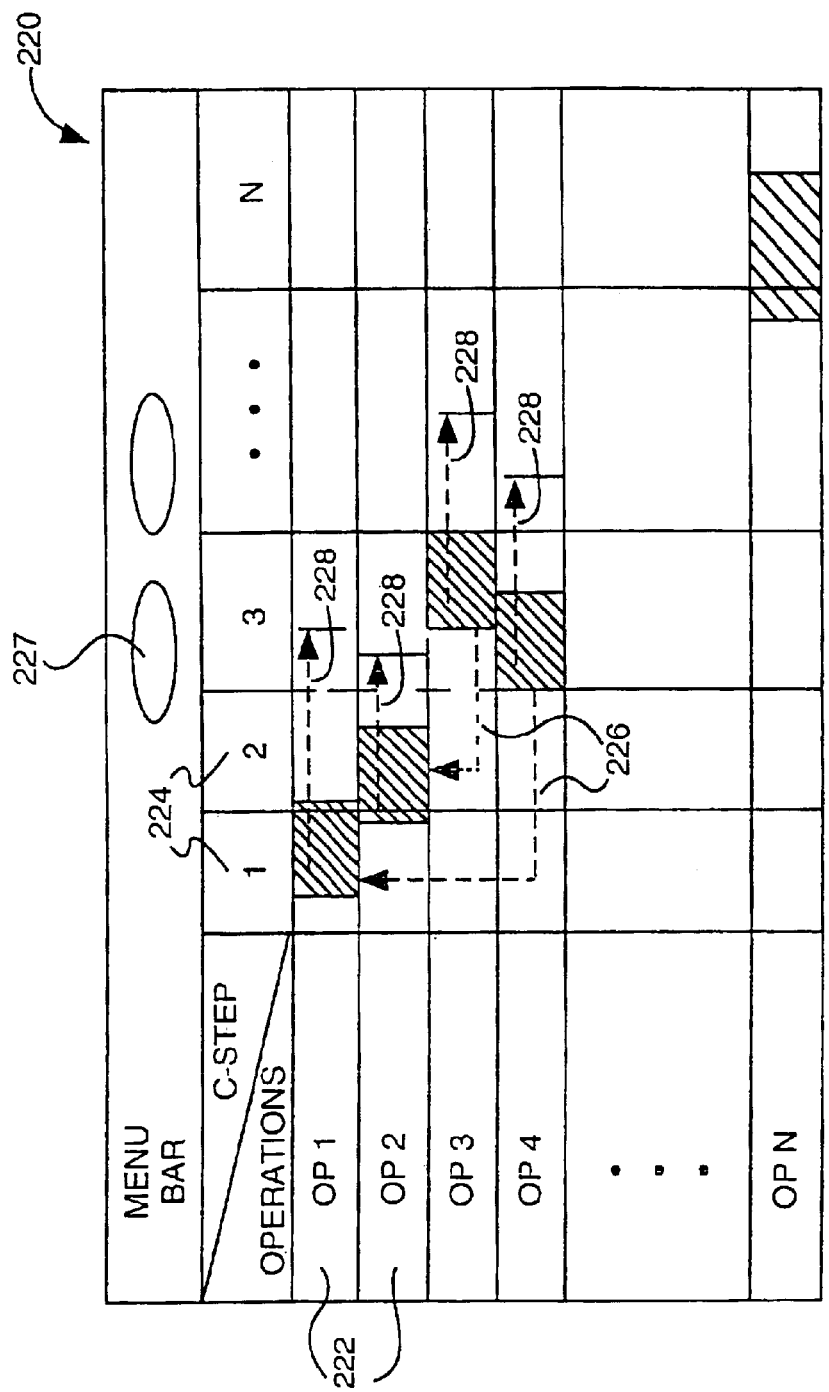
FIG. 8 illustrates one embodiment of a graphical presentation suitable for use by architecture explorer to present a candidate architecture to a designer.

FIG. 8 illustrates one embodiment of a Gantt diagram representation suitable for use by architecture explorer 104 to present a selected candidate architecture to facilitate navigation by a designer. As shown, graphically the representation 220 is similar to any conventional Gantt diagram known in the art. The specified operations of the design are shown in rows 222, with the clock cycles shown in columns 224. The clock cycles where the various specified operations are scheduled are depicted (denoted by the shading). However, the designer may select any of these information displayed, and use the representation as a navigation tool to facilitate the designer in cross probing into various issues/aspects of the design, and/or selected ones of the generated candidate architectures, to determine design alternatives. Also novel in its usage are the depictions of data dependencies in the Gantt diagram representation, denoted by arrow links 226 in Gantt diagram 220. Arrow links 226 are superimposed responsive to the designer's instructions to identifying the data dependencies of selected display items. Also novel in its usage are the depictions of mobility windows for specified operations of the design in the Gantt diagram representation, denoted by "extension lines" 228 spanning the period from the earliest possible scheduling point to the latest possible scheduling point in Gantt diagram 220. Extension lines 228 are superimposed responsive to the designer's instructions to identifying the mobility windows of the selected operations. Other visual techniques such as highlighting or coloring may also be employed.

Also novel in its usage is the facilitation of constraint modification. Through menu button 227, drop down menus for modifying constraints for selected operations displayed in Gantt diagram 220 are provided, thereby allowing the designer to modify existing constraints, delete constraints, or add constraints through interactions with the displayed elements and "menu buttons". The drop down menus are provided to the designer responsive to his/her instructions.

Figure 9:
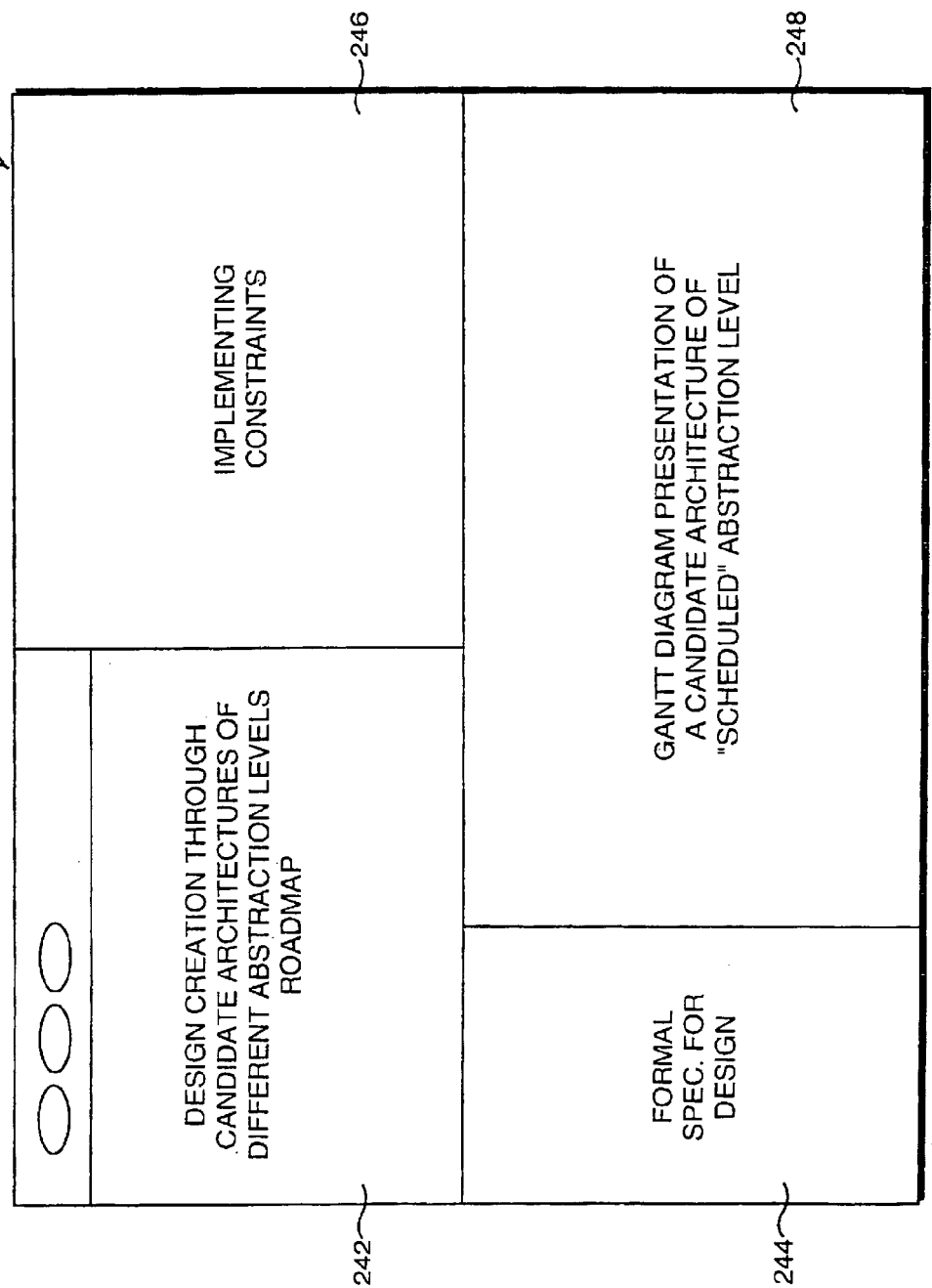
FIG. 9 illustrates one embodiment of an end user interface suitable for use by architecture explorer to facilitate interactive exploration, including interactive cross probing, by a designer.

FIG. 9 illustrates one embodiment of an end user interface, including the above described Gantt diagram representation, suitable for use by architecture explorer 104 to facilitate interactive explorations by a designer. As shown, for the illustrated embodiment, graphical end user interface 240 is partitioned into four areas, with the Gantt diagram representation 248 of a selected candidate architecture of the second "scheduled" abstraction level being displayed at the lower right hand corner to facilitate navigation by the designer, and cross probing into various issues, as described earlier. At the opposite corner, i.e. the top left corner, for the illustrated embodiment, a roadmap 242 to guide the designer in creating a design in accordance with the novel architectural exploration based design creation process is displayed. Using the roadmap 242 as a guide, and interacting with elements of the roadmap 242 for example in a conventional point and click manner, the designer is able to provide direction to have the various candidate architectures 106 of the various abstraction levels evolutionarily generated/regenerated as desired.

Displayed at the lower left corner and the top right corner, for the illustrated embodiment, are selected portions 244 of original behavioral specification 108, and selected portions 246 of constraints 110 on the design, respectively. Selected portions 244 and 246 are scrolled as appropriate. As described earlier, appropriate contents of displayed portions 244 and 246 are also highlighted responsive to the designer cross probing into certain correlation issues.

Thus, collectively end user interface 240 provides a very user friendly, and extremely effective way to facilitate interactive exploration by the designer in practicing the novel design creation process of the present invention. Clearly, numerous modifications and extensions consistent with the described embodiment are possible, and they are well within the ability of those skilled in the art.

Figure 10:
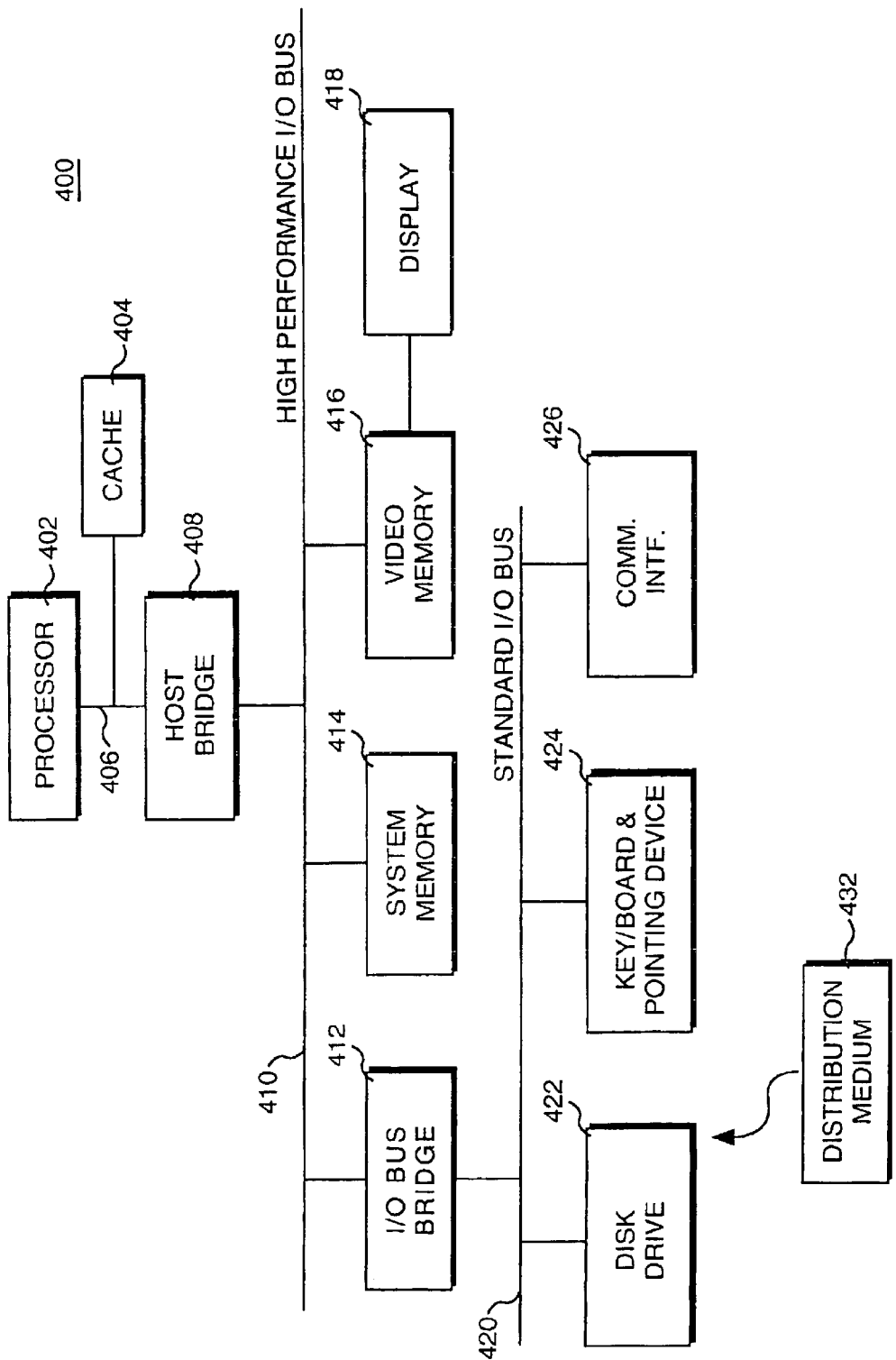
FIG. 10 illustrates one embodiment of a computer system suitable for use to practice the present invention.

FIG. 10 illustrates one embodiment of a computer system suitable to be programmed with architecture explorer/generator 100 of the present invention. As shown, for the illustrated embodiment, computer 400 includes processor 402, processor bus 406, high performance I/O bus 410 and standard I/O bus 420. Processor bus 406 and high performance I/O bus 410 are bridged by host bridge 408, whereas I/O buses 410 and 412 are bridged by I/O bus bridge 412. Coupled to processor bus 406 is cache 404. Coupled to high performance I/O bus 410 are system memory 414 and video memory 416, against which video display 418 is coupled. Coupled to standard I/O bus 420 are disk drive 422, keyboard and pointing device 424, and communication interface 426.

These elements perform their conventional functions known in the art. In particular, disk drive 422 and system memory 414 are used to store permanent and working copies of architecture explorer/generator 100 of the present invention. In one embodiment, architecture explorer/generator 100 is a component of an EDA tool. The permanent copies may be pre-loaded into disk drive 422 in factory, loaded from distribution medium 432, or down loaded from a remote distribution source (not shown). Distribution medium 432 may be a tape, a CD, a DVD or other storage medium of the like. The constitutions of these elements are known. Any one of a number of implementations of these elements known in the art may be used to form computer system 400.

Thus, the novel method for creating electronic design through architectural exploration of the present invention, including the novel method for generating candidate architectures and the novel method for facilitating interactive exploration by the designer, have been described.

The scope of the present invention is defined by the claims set forth below. The present invention may be practiced with the above described embodiments without modifications/alterations, or alternatively with modifications/alterations that are consistent with the spirit of the appended claims, including omission of some of the details as well as additions of other details.

What is claimed is:

1. A method comprising:
   receiving an algorithmic description of an electronic design;
   receiving a first set of design constraints;
   generating an initial candidate architecture of the electronic design at a first level of a plurality of abstraction levels, based on the first set of design constraints and the algorithmic description;
   providing a user with a first set of information pertaining to the initial candidate architectures the first set of information provided to facilitate generation of a second set of design constraints by the user;
   receiving from the user the second set of design constraints; and
   generating a second candidate architecture at a second level of the plurality of abstraction levels, from the initial candidate architecture and the second set of design constraints.

2. The method of claim 1 further comprising:
   receiving a user selection from one of the initial candidate architecture and the second candidate architecture;
   providing to the user, a second set of information pertaining to the user selected candidate architecture the second set of information provided to facilitate generation of a third set of design constraints by the user,
   receiving from the user the third set of design constraints; and
   generating a third candidate architecture at a third level of the plurality of abstraction levels from the user selected candidate architecture and the third set of design constraints.

3. A machine accessible medium have stored thereon a plurality of executable instructions which, when executed by a computer, cause the computer to:
   receive an algorithmic description of an electronic design;
   receive a first set of design constraints;
   generate an initial candidate architecture of the electronic design at a first level of a plurality of abstraction levels, based on the first set of design constraints and the algorithmic description;
   provide a user with a first set of information pertaining to the initial candidate architecture, the first set of information provided to facilitate generation of a second set of design constraints by the user;
   receive from the user the second set of design constraints; and
   generate a second candidate architecture at a second level of the plurality of abstraction levels, from the initial candidate architecture and the second set of design constraints.

4. The machine accessible medium of claim 3 wherein executing the instructions further cause the computer to:
   receive a user selection from one of the initial candidate architecture and the second candidate architecture;
   provide to the user, a second set of information pertaining to the user; selected candidate architecture, the second set of information provided to facilitate generation of a third set of design constraints by the user;
   receive from the user the third set of design constraints; and
   generate a third candidate architecture at a third level of the plurality of abstractions levels from the user selected candidate architecture and the third set of design constraints.

5. A computer system comprising:
   a storage medium having stored thereon a plurality of executable instructions which, when executed operate the computer system to:
   receive an algorithmic description of an electronic design,
   receive a first set of design constraints,
   generate an initial candidate architecture of the electronic design at a first level of a plurality of abstraction levels, based on the first set of design constraints and the algorithmic description, provide a user with a first set of information pertaining to the initial candidate architecture, the first set of information provided to facilitate generation of a second set of design constraints by the user, receive from the user the second set of design constraints, and generate a second candidate architecture at a second level of the plurality of abstraction levels from the initial candidate architecture and the second set of design constraints; and a processor couple to the storage medium to execute the plurality of executable instructions.

6. The computer system of claim wherein executing the instructions further operate the computer system to:

receive a user selection from one of the initial candidate architecture and the second candidate architecture;

provide to the user, a second set of information pertaining to the user selected candidate architecture, the second set of information provided to facilitate generation of a third set of design constraints by the user;

receive from the user the third set of design constraints; and generate a third candidate architecture at a third level of the plurality of abstraction levels from the user selected candidate architecture and the third set of design constraints.

7. A method comprising:

receiving a user selection of a candidate architecture from a plurality of candidate architectures, the plurality of candidate architectures generated from at least an algorithmic description of an electronic design and a first set of design constraints, and the plurality of candidate architectures being at a first level of a plurality of abstraction levels;

providing to the user, a set of information pertaining to the user selected candidate architecture, the set of information provided to facilitate generation of a second set of design constraints by the user;

receiving, from the user, the second set of design constraints; ard generating an additional candidate architecture at a second level of the plurality of abstraction levels, from the user selected candidate architecture and the second set of design constraints.

8. The method of claim 7 wherein the plurality of candidate architectures comprises representations of the algorithmic description at one or more of an allocated level of abstraction, a scheduled level of abstraction, a finite state machine extracted level of abstraction, a bound level of abstraction and a shared level of abstraction.

9. The method of claim 7 wherein the additional candidate architecture is generated to have a fast operating speed.

10. The method of claim 7 wherein the additional candidate architecture is generated to have a small implementation size.

11. The method of claim 7 wherein the set of information pertaining to the user selected candidate architecture comprises a Gantt diagram.

12. The method of claim 7 wherein the additional candidate architecture is at one of a clock-cycle scheduled abstraction level;

an allocated abstraction level;

a bound and shared abstraction level; or a finite state machine extracted abstraction level.

13. The method of claim 12 wherein an implementation specification is written from the clock cycle scheduled representation.

14. The method of claim 13 further comprising a verification analysis of the implementation specification.

15. The method of claim 7 further comprising exploration by the user into the set of information pertaining to the user selected candidate architecture.

16. A machine accessible medium have stored thereon a plurality of executable instructions which, when executed by a computer, cause the computer to:

receive a user selection of a candidate architecture from a plurality of candidate architectures, the plurality of candidate architectures generated from at least an algorithmic description of an electronic design and a first set of design constraints, and the plurality of candidate architectures being at a first level of a plurality of abstraction provide to the user, a set of information pertaining to the user selected candidate architecture, the set of information provided to facilitate generation of a second set of design constraints by the user;

receive, from the user, the second set of design constraints; and generate an additional candidate architecture at a second level of the plurality of abstraction levels, from the user selected candidate architecture and the second set of design constraints.

17. The machine accessible medium of claim 16 wherein the plurality of candidate architectures comprises representations of the algorithmic description at one or more of an allocated level of abstraction, a scheduled level of abstraction, a finite state machine extracted level of abstraction, a bound level of abstraction and a shared level of abstraction.

18. The machine accessible medium of claim 16 wherein the additional candidate architecture is generated to have a fast operating speed.

19. The machine accessible medium of claim 16 wherein the additional candidate architecture is generated to have a small implementation size.

20. The machine accessible medium of claim 16 wherein the set of information pertaining to the user selected candidate architecture comprises a Gantt diagram.

21. The machine accessible medium of claim 16 wherein the additional candidate architecture is at one of a clock-cycle scheduled abstraction level;

an allocated abstraction level;

a bound and shared abstraction level; or a finite state machine extracted abstraction level.

22. The machine accessible medium of claim 21 wherein an implementation specification is written from the clock-cycle scheduled representation.

23. The machine accessible medium of claim 22 wherein the executing instructions further operate the computer to perform a verification analysis of the implementation specification.

24. The machine accessible medium of claim 16 further comprising exploration by the user into the set of information pertaining to the user selected candidate architecture.

25. A computer system comprising:

a storage medium having stored thereon a plurality of executable instructions which, when executed operate the computer system to:

receive a user selection of a candidate architecture from a plurality of candidate architectures, the plurality of candidate architectures generated from at least an algorithmic description of an electronic design and a first set of design constraints, and the plurality of candidate architectures being at a first level of a plurality of abstraction levels;

provide to the user, a set of information pertaining to the user selected candidate architecture, the set of information provided to facilitate generation of a second set of design constraints by the user, receive, from the user, the second set of design constraints, and generate an additional candidate architecture at a second level of the plurality of abstraction levels from the user selected candidate architecture and the second set of design constraints; and a processor couple to the storage medium to execute the plurality of executable instructions.

26. The computer system of claim 25 wherein the plurality of candidate architectures comprises representations of the algorithmic description at one or more of an allocated level of abstraction, a scheduled level of abstraction, a finite state machine extracted level of abstraction, a bound level of abstraction and a shared level of abstraction.

27. The computer system of claim 25 wherein the additional candidate architecture is generated to have a fast operating speed.

28. The computer system of claim 25 wherein the additional candidate architecture is generated to have a small implementation size.

29. The computer system of claim 25 wherein the set of information pertaining to the user selected candidate architecture comprises a Gantt diagram.

30. The computer system of claim 25 wherein the additional candidate architecture is at one of a clock-cycle scheduled abstraction level;

an allocated abstraction level;

a bound and shared abstraction level; or a finite state machine extracted abstraction level.

31. The computer system of claim 30 wherein an implementation specification is written from the clock cycle scheduled representation.

32. The computer system of claim 31 wherein the executing instructions further operate the computer system to perform a verification analysis of the implementation specification.

33. The computer system of claim 25 wherein the executing instruction further operate the computer system to facilitate exploration by the user into the set of information pertaining to the user selected candidate architecture.

* * * * *

UNITED STATES PATENT AND TRADEMARK OFFICE
CERTIFICATE OF CORRECTION

PATENT NO. : 6,917,909 B1
APPLICATION NO. : 09/080869
DATED : July 12, 2005
INVENTOR(S) : Markov et al.

It is certified that error appears in the above-identified patent and that said Letters Patent is hereby corrected as shown below:

In the Specification:

Col. 5, line 62, please replace the phrase "ability handle" with the phrase --ability to handle--.

Col. 8, line 46, please replace the word "reenerating" with the word --regenerating--.

Col. 10, line 43, please replace "1061" with --106i--.

Col. 13, line 18, please replace "1829" with --182g--.

Col. 14, line 63, please replace "1881" with --188i--.

Col. 14, line 64, please replace "188J" with --188j--.

In the Claims:

Col. 18, line 2, please replace the word "architectures" with the word --architecture,--.

Col. 18, line 50, please replace the phrase "user; selected" with --user selected--.

Col. 19, line 13, please replace the phrase "couple to" with --coupled to--.

Col. 19, line 15, please replace the phrase "claim wherein" with --claim 5 wherein--.

Col. 19, line 43, please replace the word "ard" with --and--.

Col. 20, line 18, please replace the word "abstraction" with --abstraction levels;--.

Col. 21, line 16, please replace the phrase "couple to" with --coupled to--.

UNITED STATES PATENT AND TRADEMARK OFFICE
CERTIFICATE OF CORRECTION

PATENT NO. : 6,917,909 B1
APPLICATION NO. : 09/080869
DATED : July 12, 2005
INVENTOR(S) : Markov et al.

It is certified that error appears in the above-identified patent and that said Letters Patent is hereby corrected as shown below:

Col. 22, lines 17-20, please replace claim 32 with the following:
--32. The computer system of claim 31 further comprising a verification analysis of the implementation specification.--

Signed and Sealed this

Seventeenth Day of April, 2007

JON W. DUDAS
*Director of the United States Patent and Trademark Office*